United States Patent [19]
Iida

[11] Patent Number: 6,124,903
[45] Date of Patent: Sep. 26, 2000

[54] LIQUID CRYSTAL DISPLAY DEVICE

[75] Inventor: Masayuki Iida, Kagoshima, Japan

[73] Assignee: Sony Corporation, Tokyo, Japan

[21] Appl. No.: 09/382,394

[22] Filed: Aug. 25, 1999

[30] Foreign Application Priority Data

Aug. 28, 1998 [JP] Japan .................. 10-243502

[51] Int. Cl.[7] .......................... G02F 1/1343; G02F 1/136
[52] U.S. Cl. ................ 349/38; 349/38; 349/39; 349/44
[58] Field of Search .................. 349/38, 44, 39

[56] References Cited

U.S. PATENT DOCUMENTS

| | | | |
|---|---|---|---|
| 5,724,107 | 3/1998 | Nishikawa et al. | 349/38 |
| 5,745,194 | 4/1998 | Nakashima et al. | 349/38 |
| 5,777,701 | 7/1998 | Zhang | 349/44 |
| 5,828,430 | 10/1998 | Nishida | 349/44 |
| 5,844,641 | 12/1998 | Jun et al. | 349/38 |
| 5,953,088 | 9/1999 | Hanazawa et al. | 349/110 |
| 5,966,193 | 10/1999 | Zhang et al. | 349/110 |
| 5,986,723 | 11/1999 | Nakamura et al. | 349/39 |

FOREIGN PATENT DOCUMENTS

| | | |
|---|---|---|
| 5-150262 | 6/1993 | Japan . |
| 5-257164 | 10/1993 | Japan . |
| 10-70277 | 3/1998 | Japan . |

*Primary Examiner*—Kenneth Parker
*Assistant Examiner*—Mike Qi
*Attorney, Agent, or Firm*—Ronald P. Kananen; Rader, Fishman & Grauer

[57] ABSTRACT

In a liquid crystal display device including a light shielding film, the liquid crystal display device having a structure capable of avoiding a gate line delay is provided. In the liquid crystal display device including a thin film transistor formed on a substrate, a portion of a light shielding film for shielding against incident light from the side of the substrate, except its portion for shielding the pixel transistor, is disposed under an additional capacitance line or between a gate line and the additional capacitance line and at a position avoiding the gate line, so that parasitic capacitance between the film and the gate line is suppressed.

8 Claims, 5 Drawing Sheets

STRUCTURE OF EMBODIMENT 1

(PLANAR STRUCTURE)

(SECTIONAL STRUCTURE 1)

(SECTIONAL STRUCTURE 2)

STRUCTURE OF EMBODIMENT 1

LIQUID CRYSTAL DISPLAY DEVICE

BACKGROUND OF THE INVENTION

1. Field of the Invention

The present invention relates to a liquid crystal display device, and particularly to a liquid crystal display device provided with a thin film transistor formed on a substrate.

2. Description of the Related Art

A liquid crystal display device is known a liquid crystal display device is known in which a thin film transistor is formed on a substrate made of, for example, glass or quartz (Japanese Patent Unexamined Publication No. Hei. 5-150262, No. Hei. 5-257164, No. Hei. 10-70277, and so forth). The thin film transistor (hereinafter properly referred to as TFT) functions as a display electrode.

A conventional device of this kind, for example, a liquid crystal display device formed of a p-Si (polysilicon) thin film transistor, an a-Si (amorphous silicon) thin film transistor, or the like has a problem that such a phenomenon occurs that an off current of a pixel transistor is increased by light incident from the side of a substrate (a quartz substrate, and so forth) or scattered light incident from the opposite side of the substrate, and a pixel potential leaks. This phenomenon has a large tendency to occur especially in the case where the liquid crystal display device is used for a projector.

For the purpose of avoiding the phenomenon, in the related art, as shown in a plane structure of FIG. 1 and sectional structures of FIGS. 2 and 3, a metal layer made of, for example, (W) or its silicide which does not transmit light, is disposed as a light shielding film just under a pixel transistor. A peripheral portion of the light shielding film, for example, the metal layer is connected to a fixed potential of Vss, Vcom, or the like. Although not shown, for the purpose of blocking off scattered light incident from the opposite side of the substrate, contrary to FIGS. 2 and 3, there is such a case that a metal layer of, for example, (Ti) which does not transmit light, is disposed as a light shielding film just over a pixel transistor, and its peripheral portion is likewise connected to a fixed potential of Vss, Vcom, or the like.

However, in such a connection method of the metal layer in the related art, the delay of a gate line potential is caused by parasitic capacitance constituted by the metal layer of the light shielding film with the fixed potential and a gate line for controlling the pixel transistor, which is made of, for example, doped polysilicon (DOPOS). As a result, such disadvantage is caused that the contrast of a liquid crystal display is lowered, or uniformity is deteriorated.

The structure and the problem of the related art will be further explained with an example of a case where the light shielding film is disposed just under the pixel transistor and with reference to FIGS. 1 to 3. FIG. 1 is a view showing the related art in the plane structure of a portion including the metal layer forming the light shielding film and a data line, FIG. 2 is a sectional view taken along line A–A' of FIG. 1, and FIG. 3 is a sectional view taken along line C–C' of FIG. 1.

As shown in FIGS. 1 to 3, pixel transistors 22 and 24 are constituted by first silicon layers 21 and 23 made of, for example, undoped silicon formed on a substrate 10 (here, a quartz substrate), and a gate line 3 (i.e, a second silicon layer) made of, for example, DOPOS, in which a gate insulating film 31 made of, for example, SiO2 intervenes between them. As mentioned above, since it is necessary to shield the pixel transistors 22 and 24 against light, as shown in FIG. 2, a metal layer made of, for example, W or its silicide is provided as a light shielding film 1 at the side of the substrate 10 here. This light shielding film 1 is shown especially by fine dots in FIG. 1. As shown in the drawings, this light shielding film 1 is connected to a metal layer 7 made of, for example, aluminum (Al), having a fixed potential such as Vss or Vcom and the light shielding film 1 is formed just under or beneath the gate line 3 in the related art of this case. The gate line 3 and an additional capacitance line 4 are formed of a second silicon layer made of, for example, DOPOS, and are especially shown by oblique lines in FIG. 1.

As described above, in the related art, since the light shielding film 1 connected to the metal layer 7 with the fixed potential is formed close to the gate line 3, the delay of the gate line potential is caused by the parasitic capacitance formed to the metal layer 7 with the fixed potential and the gate line 3, and a problem resulting from this can occur.

In FIGS. 1 to 3, reference numeral 6 denotes a second contact; 8 denotes a first contact; 51 and 52 denote data lines made of, for example, Al; 9 denotes an opening portion; 11 denotes a first insulating layer made of, for example, TEOS—SiO2; 12 denotes a second insulating layer made of, for example, phosphorus-containing silicon glass (PSG); 13 denotes a third insulating layer made of, for example, PSG; 14 denotes a flattened film made of, for example, SOG; 15 denotes a transparent electrode layer made of, for example, ITO; 16 denotes a liquid crystal layer made of, for example, twisted nematic (TN) liquid crystal; 17 denotes an opposite substrate side transparent electrode layer made of, for example, ITO; and 18 denotes an opposite substrate made of, for example, quartz.

SUMMARY OF THE INVENTION

The present invention has been made to solve the foregoing problems, and an object of the invention is to provide a liquid crystal display device including a light shielding film with a structure capable of avoiding a gate line delay.

In a liquid crystal display device including a thin film transistor formed on a substrate, the liquid crystal display device of the present invention is characterized in that a light shielding film for shielding against light incident from the side of the substrate or scattered light incident from the opposite side of the substrate is disposed such that its portion except a portion for shielding a pixel transistor is disposed over or under an additional capacitance line or between a gate line and the additional capacitance line and at a position avoiding the gate line.

According to the present invention, the portion of the light shielding film (i.e., a light shielding metal layer, and so forth) except the portion shielding the pixel transistor is not disposed close to the gate line. The structure of such arrangement makes it possible that the problem of the parasitic capacitance be reduced, the load of a gate line driving transistor be reduced, and the delay of a gate pulse be suppressed.

DESCRIPTION OF THE PREFERRED EMBODIMENTS

Figure 1:
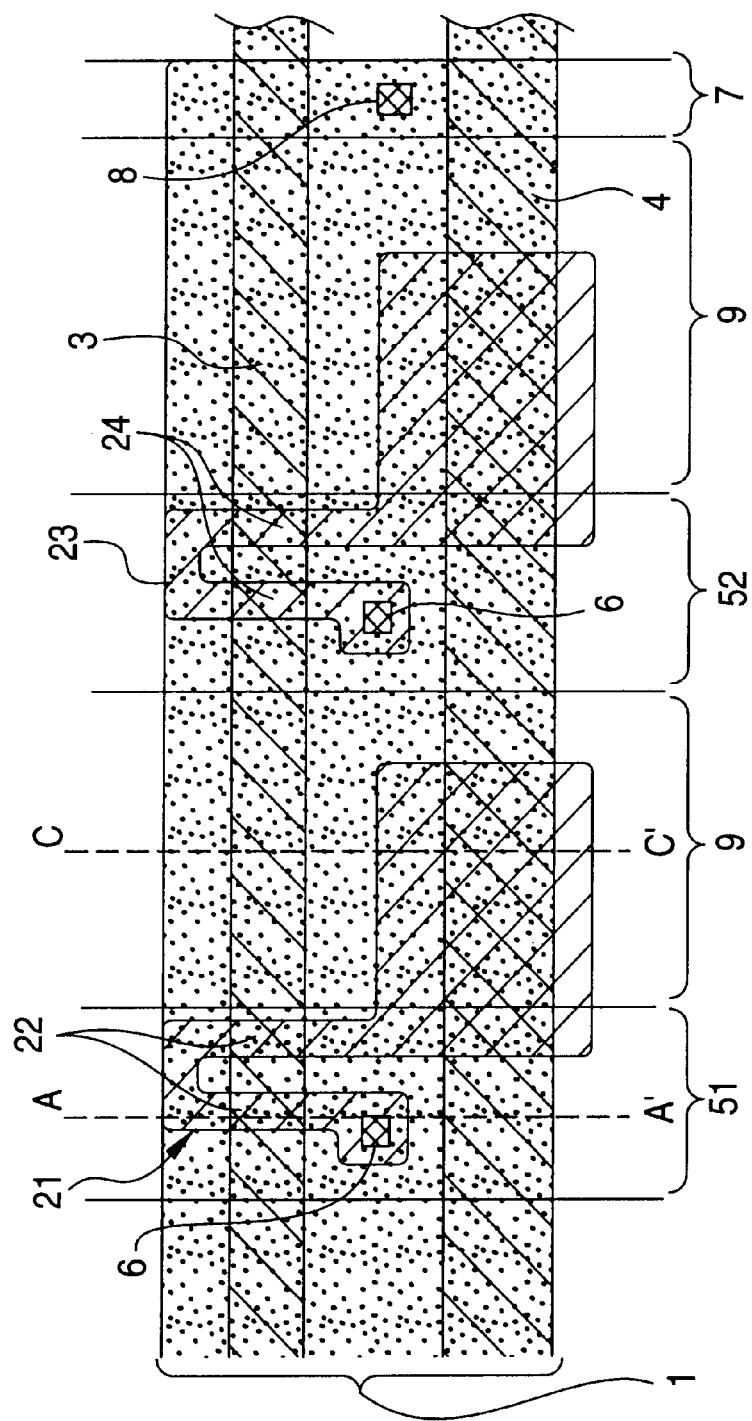
FIG. 1 is a view showing a conventional structure in a plane structure.

Preferred embodiments of the present invention will be described in detail below with reference to the drawings. However, the present invention is not limited to the embodiments described below and shown in the drawings, but can be suitably applied to a structure having the same effect, for example, a structure in which a light shielding film is disposed over a pixel transistor.

Embodiment

Figure 2:
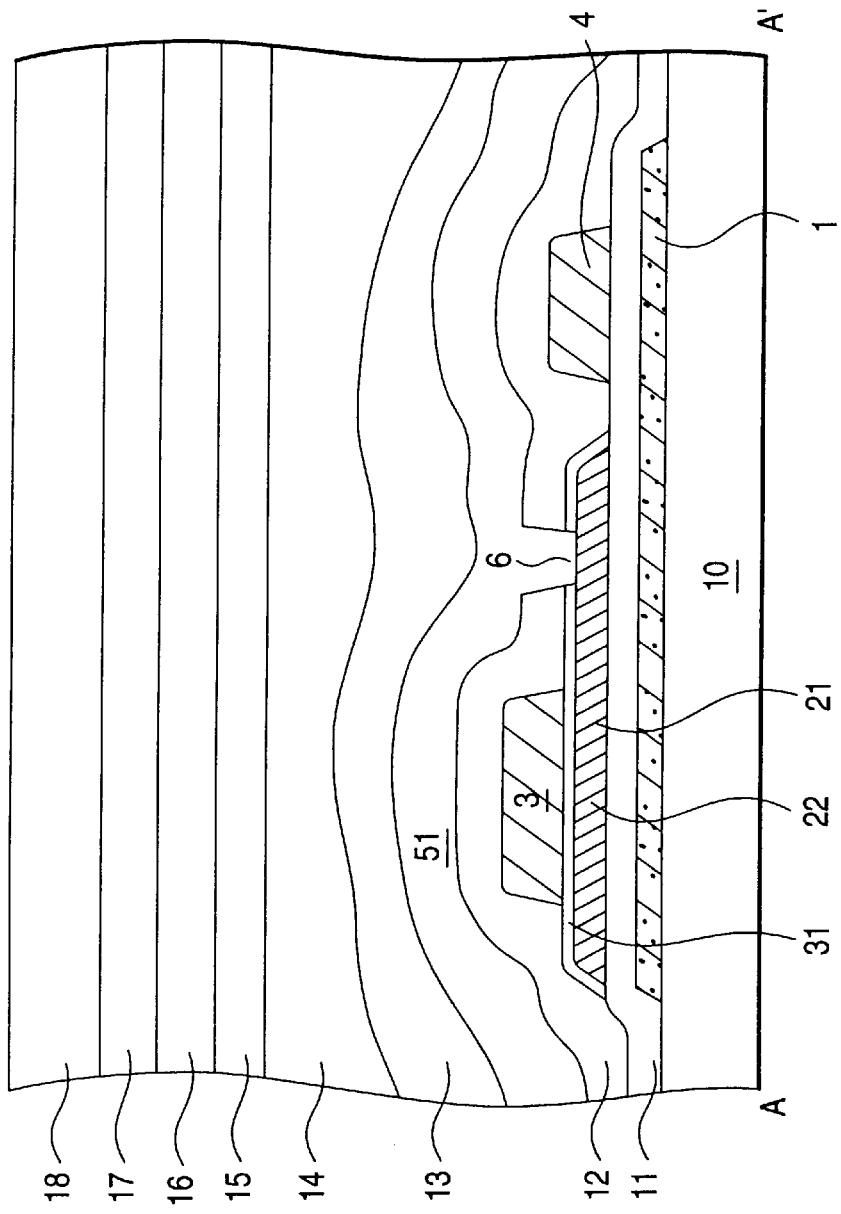
FIG. 2 shows the conventional structure in a sectional structure and is a sectional view taken along line A–A' of FIG. 1.
Figure 3:
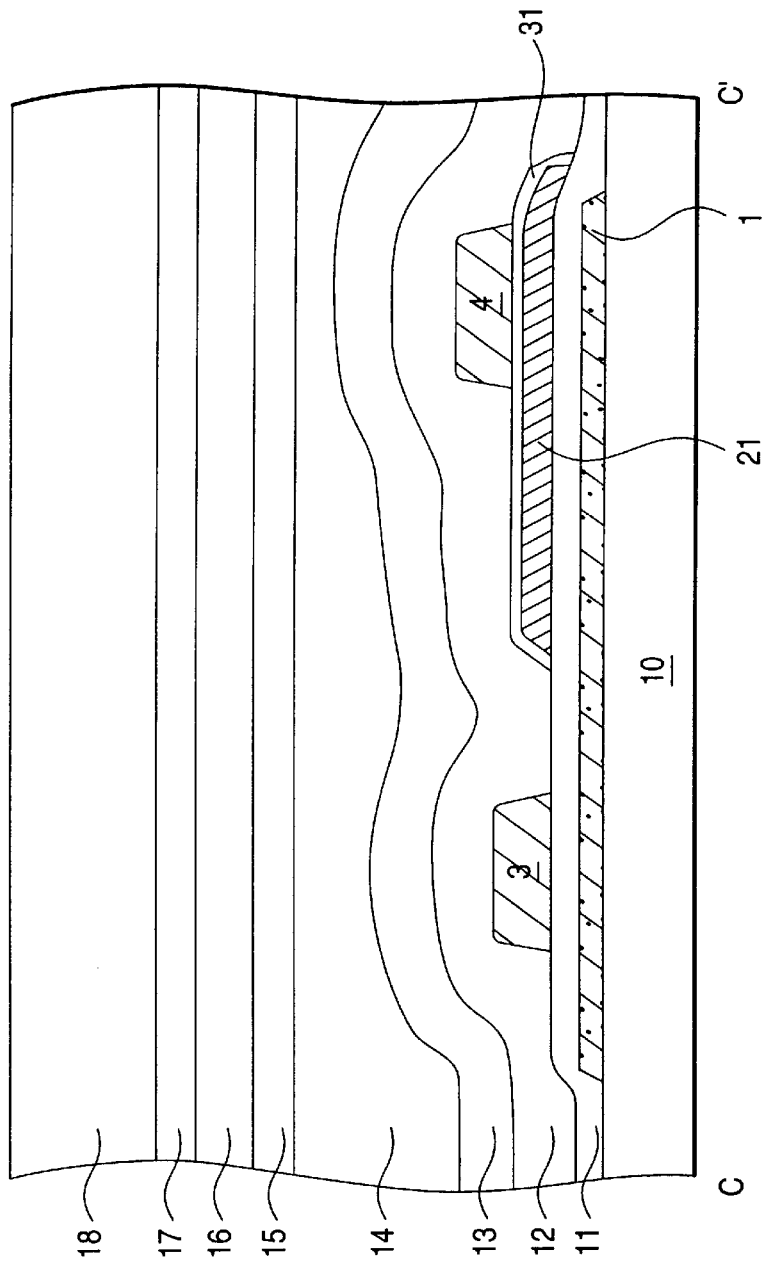
FIG. 3 shows the conventional structure in a sectional structure and is a sectional view taken along line C–C' of FIG. 1.
Figure 4:
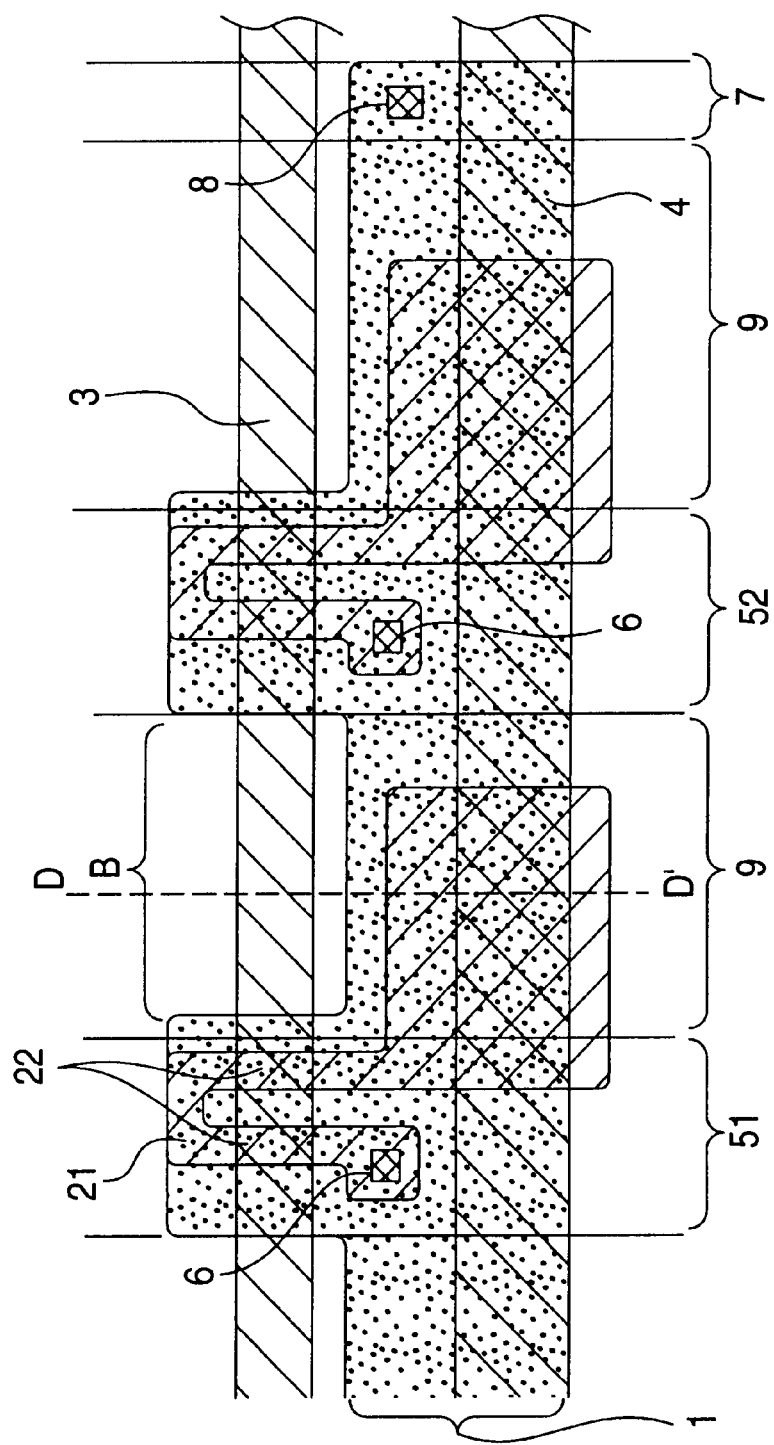
FIG. 4 is a view showing a first embodiment of the present invention in a plane structure.
Figure 5:
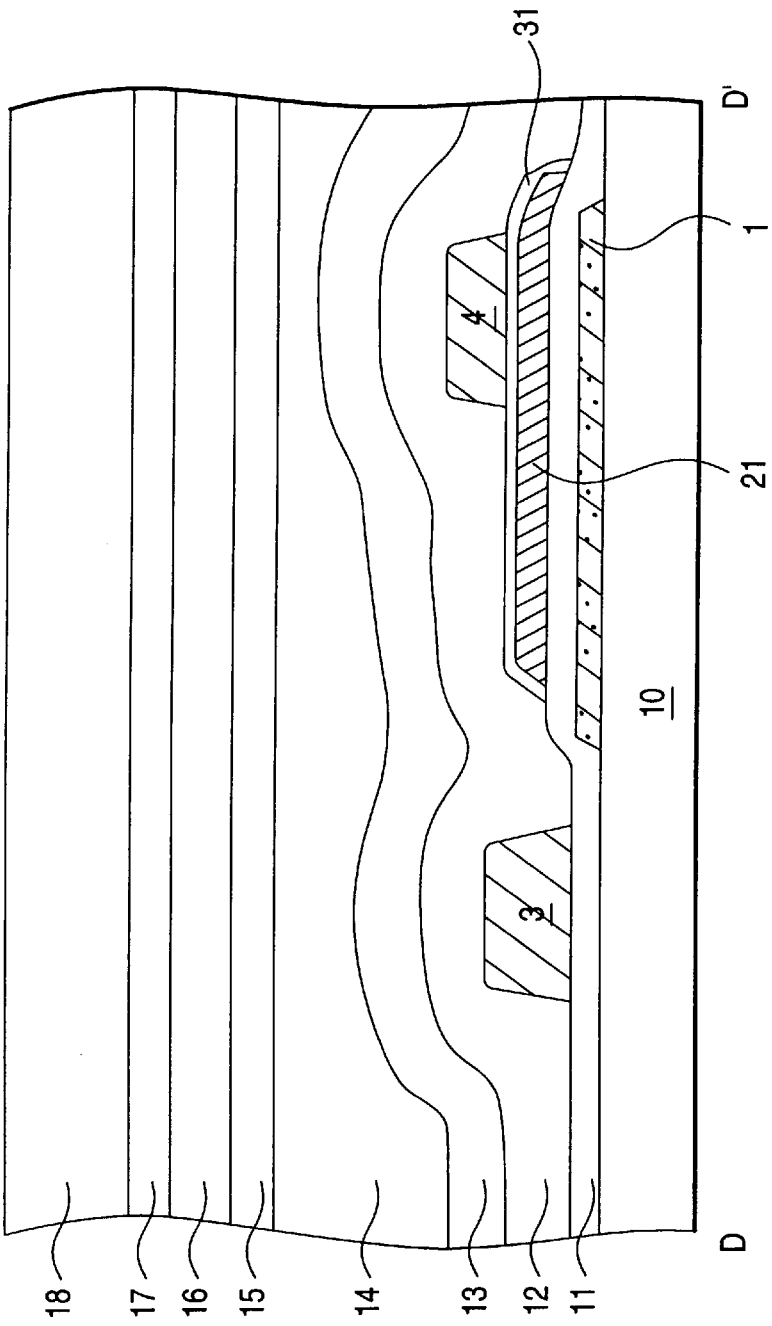
FIG. 5 shows the first embodiment of the present invention in a sectional structure and is a view taken along line D–D' of FIG. 4.

The structure of this embodiment is shown in FIG. 4 showing a plane structure (corresponding to FIG. 1 showing the related art) and in FIG. 5 showing a sectional structure (corresponding to FIG. 3 showing the related art). Although this embodiment is a liquid crystal display device having almost the same structure as that shown in FIGS. 1 to 3, the structure of a light shielding film 1 is different. Reference numerals in FIGS. 4 and 5 correspond to those shown in FIGS. 1 to 3.

As shown in FIGS. 4 and 5, a pixel transistor 22 is formed of a first silicon layer 21 of, for example, undoped silicon formed on a substrate 10 (here, a quartz substrate) and a gate line 3 (i.e., a second silicon layer) made of, for example, DOPOS, in which a gate insulating film 31 made of, for example, SiO2 intervenes between them). As described above, since it is necessary to shield the pixel transistor 22 against light, as shown in FIG. 5, a metal layer made of, for example, W or its silicide is provided as the light shielding film 1, in this case at the side of the substrate 10 here. This light shielding film 1 is shown especially by fine dots in FIG. 5. As shown in the drawing, this light shielding film 1 is connected to a metal layer 7 made of, for example, Al and having a fixed potential such as Vss or Vcom. In the related art of this case, the light shielding film 1 is formed just under the gate line 3. The gate line 3 and an additional capacitance line 4 are respectively formed of a second silicon layer made of, for example, DOPOS, and are especially shown by oblique lines in FIG. 4 as well.

In this case, as a portion to be shielded, a portion just under the thin film pixel transistor made of, for example, p—Si is inevitable, and as other portions, it is sufficient if only a part of the periphery of the pixel transistor is shielded against oblique light. Thus, in this embodiment, the light shielding film 1 (formed of a light shielding metal layer made of, for example, W or its silicide, and is shown by fine dots similarly to the foregoing) has a structure as described below. That is, such a structure is adopted that the light shielding film 1 hardly exists just under the gate line 3 made of,for example, DOPOS. Specifically, the light shielding film 1 is disposed in such a manner that it avoids the gate line 3 and its portion corresponding to the gate line 3 is cut away. For example, in a section taken along line D–D' in the portion designated by B in FIG. 4, such a structure is made that the light shielding film 1 extends while avoiding the gate line 3 as shown in the drawing.

For the connection between adjacent pixels or to the peripheral metal layer 7 made of, for example, Al, and having a fixed potential of Vss or Vcom, the light shielding film 1 is disposed under the additional capacitance line 4 made of, for example, DOPOS, or as shown in the drawing between the gate line 3 and the additional capacitance line 4 (avoiding the portion under the gate line 3).

By this structure, such a structure is obtained that even when the light shielding film 1 of the light shielding metal layer or the like is connected to the fixed potential, the increase in parasitic capacitance between the film 1 and the gate line 3 can be suppressed, the load amount of the gate line 3 can be suppressed to the minimum, and the delay of the gate potential becomes very small.

As a result, in this preferred embodiment, the improvement of contrast and uniformity can be realized, and the picture quality of the liquid crystal display device can be improved.

As described above, according to the present invention, in the liquid crystal display device including the light shielding film, the gate line delay can be avoided, the delay of the gate potential can be suppressed, and the improvement of the picture quality of the liquid crystal display device, such as contrast and uniformity, can be realized.

What is claimed is:

1. A liquid crystal display device, comprising:

a first substrate on which a pixel transistor formed of a semiconductor layer, and a light shielding film for shielding against incident light or scattered light are formed, wherein a portion of said light shielding film except its portion for shielding said pixel transistor is disposed beneath an additional capacitance line at a position avoiding said gate line, said light shielding film being connected to a potential so that an increase in parasitic capacitance between the light shielding film and the gate line is suppressed, a load amount on the gate line is suppressed, and a delay of gate potential is small;

said first semiconductive layer being located beneath the capacitance line and spaced from the lights shielding film by a gate insulating film and substantially in register with the light shielding film at a location not beneath the gate line;

a second substrate disposed opposite to said first substrate and with a predetermined interval; and a liquid crystal layer held between said first substrate and said second substrate.

2. A liquid crystal display device according to claim 1, wherein said light shielding film is disposed between said substrate and said pixel transistor.

3. A liquid crystal display device according to claim 1, wherein said light shielding film is disposed over said pixel transistor.

4. A liquid crystal display device, comprising:

a first substrate and a second substrate opposite said first substrate with a liquid crystal layer held between said first and second substrate;

a light shielding film formed on said first substrate;

a pixel transistor formed of a first silicon layer on said first substrate, said light shielding film for shielding against incident or scattered light;

a gate line;

a capacitance line, said capacitance line and said gate line formed of a second silicon layer;

a gate insulating film;

said light shielding film formed substantially beneath said first silicon layer and extending so as to terminate at a location which is not beneath said gate line, and disposed under said capacitance line, said light shielding film being connected to a fixed potential so that an increase in parasitic capacitance between the light shielding film and the gate line is suppressed, a load amount on said gate line is suppressed and a delay of gate potential is small.

5. The liquid crystal display device as set forth in claim 4, wherein said first silicon layer is located beneath said capacitance line and spaced from said light shielding film by a gate insulating film and substantially in register with said light shielding film at a location not beneath said gate line.

6. The liquid crystal display device as set forth in claim 5 wherein said light shielding film is made from a metal and is connected to a metal layer having a fixed potential.

7. A liquid crystal display device comprising:

a first substrate;

a semiconductor layer formed on said first substrate;

a gate line;

a capacitance line;

a light shielding film formed substantially beneath said semiconductor layer and extending so as to terminate at a location which is not beneath said gate line and disposed under said capacitance line, the light shielding film being connected to a fixed potential so that an increase in parasitic capacitance between the light shielding film and the gate line is suppressed, a load amount on the gate line is suppressed and a delay of gate potential is small;

the first semiconductor layer being located beneath the capacitance line and spaced from the light shielding film by a gate insulating film and substantially in register with the light shielding film at a location not beneath the gate line;

the light shielding film being made from metal and connected to a metal layer having a fixed potential.

8. The liquid crystal display device according to claim 7, wherein said first semiconductor layer is a silicon layer.

* * * * *